United States Patent [19]

Wheatley, Jr.

[11] 4,313,971
[45] Feb. 2, 1982

[54] METHOD OF FABRICATING A SCHOTTKY BARRIER CONTACT

[75] Inventor: Carl F. Wheatley, Jr., Somerset, N.J.

[73] Assignee: RCA Corporation, New York, N.Y.

[21] Appl. No.: 42,920

[22] Filed: May 29, 1979

[51] Int. Cl.³ .................... H01L 21/225; H01L 29/48
[52] U.S. Cl. ...................... 427/84; 148/187;
148/191; 427/89; 427/90; 427/93
[58] Field of Search .............. 427/84, 89, 93, 90; 148/191, 187

[56] References Cited

U.S. PATENT DOCUMENTS

| Re. 28,385 | 4/1975 | Mayer | 427/93 |
|---|---|---|---|
| 3,143,443 | 8/1964 | Maserjian | 148/178 |
| 3,193,419 | 7/1965 | White | 148/191 |
| 3,588,633 | 6/1971 | Hayden | 29/576 |
| 3,706,128 | 12/1972 | Heer . | |
| 3,849,789 | 11/1974 | Cordes . | |
| 3,943,552 | 3/1976 | Shannon . | |
| 3,964,084 | 6/1976 | Andrews . | |
| 4,045,248 | 8/1977 | Shannon . | |
| 4,110,488 | 8/1978 | Risko | 427/84 |
| 4,173,063 | 11/1979 | Kniepkamp | 427/84 |

FOREIGN PATENT DOCUMENTS 731834 4/1966 Canada ............................ 148/191

OTHER PUBLICATIONS

Statz, "Fabricating Field Effect Transistors", IBM TDB vol. 11, No. 4, Sep. 1968, p. 397.

Primary Examiner—John D. Smith
Attorney, Agent, or Firm—Birgit E. Morris; Donald S. Cohen; Robert P. Seitter

[57] ABSTRACT

A Schottky barrier contact is formed by depositing the conductor portion of the Schottky barrier contact on a surface of a semiconductor from which a conductivity determining dopant has been leached to create a surface region of reduced dopant concentration. This process is compatible with the formation of an ohmic contact to an increased conductivity portion of the semiconductor material, an unleached portion of the semiconductor material or to a leached portion of the semiconductor material.

6 Claims, 17 Drawing Figures

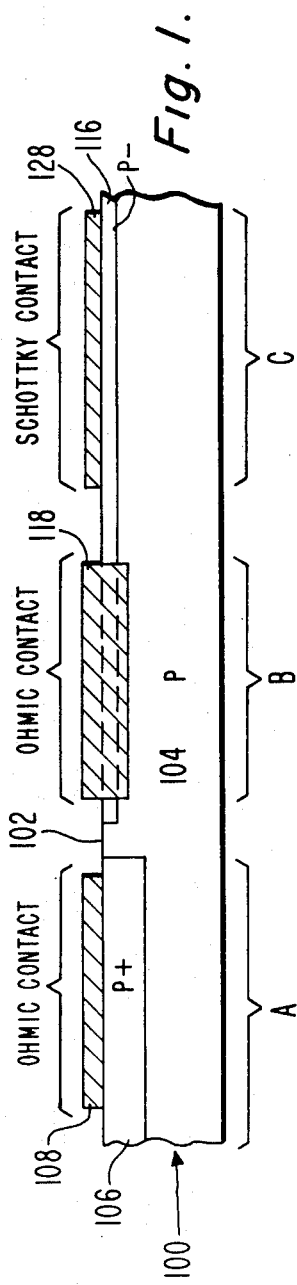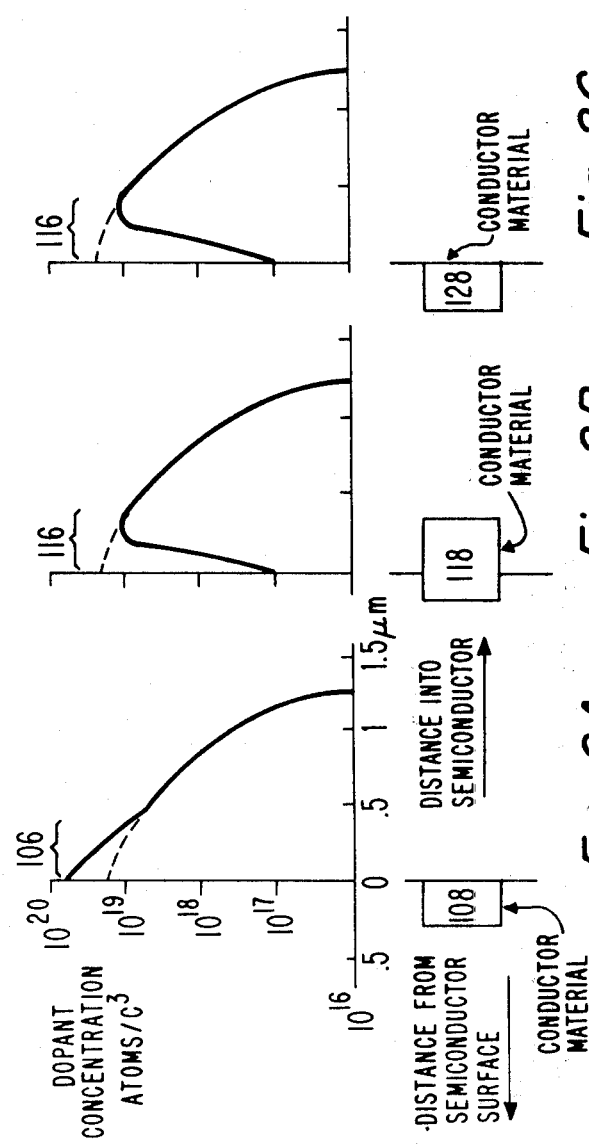

4,313,971

METHOD OF FABRICATING A SCHOTTKY BARRIER CONTACT

BACKGROUND OF THE INVENTION

1. Field of the Invention

The invention relates to the field of forming Schottky barrier contacts to semiconductor materials.

2. Prior Art

A Schottky barrier contact has the advantage over a semiconductor junction diode that its forward voltage drop is controllable by the selection of the metal used in forming it. A Schottky barrier contact or diode is formed when an appropriate metal is deposited on a semiconductor material having a dopant concentration which is below a threshold concentration above which a desired Schottky barrier cannot be formed.

A dopant concentration which is higher than the threshold for Schottky barrier contact formation is often desirable in semiconductor devices, either at some portions of the wafer surface not within the Schottky barrier contact region or else within the portion of the wafer where the Schottky barrier contact is formed, but just far enough below the surface to allow the Schottky contact to be formed. In order to form a Schottky barrier contact at the surface of a semiconductor which has a dopant concentration which is higher than the threshold level, a low dopant concentration epitaxial layer is grown in order to support the Schottky contact.

An improved technique is needed for forming Schottky barrier contacts to the surface of semiconductor layers which have high dopant concentrations.

SUMMARY OF THE INVENTION

The present invention overcomes the problems of providing an appropriately low dopant concentration where a Schottky barrier contact is to be formed to a semiconductor structure which has two high dopant concentrations elsewhere by leaching some of the dopant from the surface portion of the semiconductor material in the region where the Schottky contact is to be formed. The conductor portion of the Schottky barrier contact is deposited on the leached region. Ohmic contacts to the semiconductor may be made simultaneously, or sequentially.

BRIEF DESCRIPTION OF THE DRAWINGS

FIGS. 1 and 2A, 2B and 2C illustrate the principles utilized in this invention.

DETAILED DESCRIPTION OF THE PREFERRED EMBODIMENT

Figure 3:
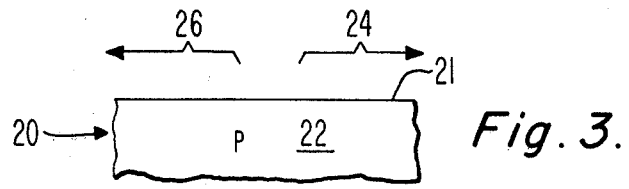
FIGS. 3 through 6 illustrate steps in a first method of forming a Schottky barrier contact and an ohmic contact to the same layer of semiconductor material.

In FIG. 1, a wafer 100 having three segments A, B and C is illustrated. An electrical contact is provided to each of these sections along a first surface 102 of the wafer 100. The concentration of conductivity type determining dopant atoms in sections A, B and C are illustrated in FIGS. 2A, 2B and 2C, respectively. These concentrations are illustrated on a log scale versus distance into the semiconductor material in a direction perpendicular to the first surface 102.

Segment A includes a P+ region 106 adjacent surface 102. Region 106 has been diffused into the P type material 104. The dashed portion of the curve in FIG. 2A illustrates the concentration in the region 106 prior to the diffusion of the P+ region. Contact metallization 108 is disposed on the surface 102 of the P+ region 106. The contact metallization 108 rests on the surface of the semiconductor material and forms an ohmic contact to the high dopant concentration material of region 106 without the need to penetrate the surface of the semiconductor to form the ohmic contact. Thus, lack of penetration is illustrated in FIG. 2A where the metallization does not penetrate into the semiconductor material.

In segments B and C, a region 116 along the surface 102 has been partially depleted of P type dopant atoms with the result that the highest dopant concentration in the segments B and C occurs substantially below the surface 102 of the wafer 100. The partial depletion of dopant atoms in the region 116 is preferably accomplished by slow oxidation of the surface under an ambient atmosphere and temperature conditions which yield substantial leaching of the dopant material. The dopant concentration in the region 116 prior to the leaching is illustrated by the dashed portions of the curves in FIGS. 2B and 2C.

In segment B, an ohmic contact is desired to the region 104 of the wafer 100. Consequently, a contact metallization 118 is disposed on and defined within the area where ohmic contact is desired. The wafer is then sintered or otherwise processed to cause the contact metallization 118 to alloy with the semiconductor material of wafer 100 until the contact metallization 118 and its contiguous intermetallic compound or alloy region extends inward beyond the boundary of the partially depleted region 116. In this way, the metallization 118 makes contact to the high concentration portion of the region 104. This penetration produces the desired ohmic contact. The penetration is illustrated in FIG. 2B by the metallization 118 extending into the semiconductor material further than the leached region 116 does.

In segment C, a Schottky barrier contact is desired. For this contact, the metallization material 128 is selected which will form the desired Schottky barrier with the region 116. This metallization is disposed on the surface 102 of the wafer 100 within segment C and defined to the desired contact location. As illustrated in FIG. 2C, this metallization rests on the surface of region 116 without significantly penetrating that surface. This results in the desired Schottky barrier contact.

Process steps in a first fabrication method in accordance with the invention are illustrated in FIGS. 3–6. FIG. 3 illustrates a wafer 20 of semiconductor material which has an upper surface 21 and includes, adjacent the surface 21, a region 22 to which ohmic and Schottky barrier contacts are to be made. The region 22 may preferably be silicon doped with boron so that it is P type material. The ohmic contact will be made to a portion 24 of the region 22 and the Schottky barrier contact will be made to a portion 26 of the region 22. The dopant concentration at the surface of the region 22 is high enough (typically in excess of $10^{18}$ atoms/cm$^3$) that the desired Schottky barrier contact cannot be formed in the portion 26 of region 22 because an ohmic contact will form instead. In accordance with the invention, rather than following the prior art teaching of adding an additional layer of semiconductor material to the portion 26, the present invention leaches dopant materials from the region 22 to form a surface portion having a low enough residual dopant concentration that the desired Schottky barrier contact can be formed.

Figure 4:
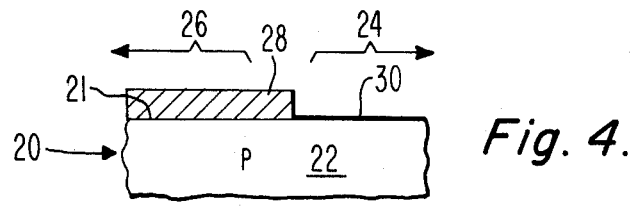

As illustrated in FIG. 4, a mask 28 is formed to protect at least the (Schottky) portion 26 of the wafer surface 21 while leaving exposed at least the (ohmic) portion 24 of the surface. A P type dopant is then introduced into the (ohmic) portion 24 in an appropriate manner. It is preferred to deposit a source 30 of a P type dopant such as boron on the surface 21 of the portion 24. This dopant source may preferably be a borosilicate glass, although other means of enriching the surface 21 are known to those skilled in the art and may be used. The mask 28 may be removed once it is no longer needed.

Figure 5:
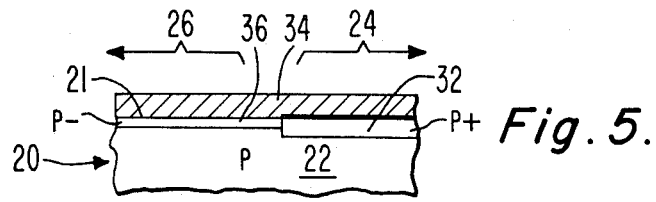

Next, by the following procedure, the wafer is processed to the stage illustrated in FIG. 5. In accordance with this first embodiment, the wafer is exposed to an oxidizing environment at a temperature in the range of 950° C. to 1050° C. for a period of time (preferably several hours) sufficient to form a heavily doped (greater than $10^{18}$ dopant atoms/cm$^3$) P+ diffusion 32 within the region 22 along the surface 21 of the portion 24. Simultaneously, an oxide layer 34 is formed over the entire surface 21 of the wafer. Where the growth of the oxide layer 34 is used to leach the dopant from the surface region of the portion 26, it is preferred that the oxide grow slowly in order that it may leach a substantial quantity of boron from the surface portions of those areas of the wafer where the dopant source 30 was not deposited. This leaching action forms a shallow (500 to 5000 Å deep) P− region 36 along the surface 21 of the wafer, except where the P+ regions 32 were formed.

The P− (leached) region which results from the exposure of the wafer to these conditions will have a surface dopant concentration of about $10^{17}$ or fewer dopant atoms/cm$^3$ of semiconductor material.

This is a low enough dopant concentration that a Schottky barrier contact can be formed using aluminum metallization or any of a number of other well-known metallizations.

If a greater reduction in dopant concentration is required, either because of the metal to be used or because of a higher initial dopant concentration, the oxide layer 34 may be stripped from the wafer and an additional oxide layer grown to cause additional leaching. Following the above formation of the regions 32 and 36 and the growth of the oxide layer 34, the wafer 20 appears as illustrated in FIG. 5.

The rate of growth of the leaching oxide layer can be controlled both by the ambient atmosphere and temperatures and by the thickness, if any, of any pre-existing oxide layer. The thicker a pre-existing layer is the slower the leaching layer will grow, other conditions being equal.

Figure 6:
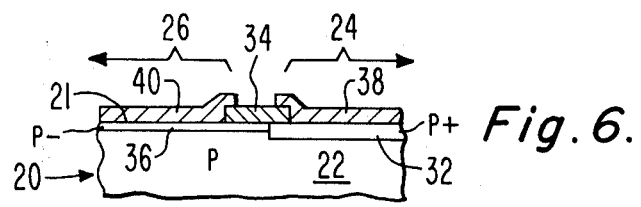

The oxide layer 34 may be left on the wafer as an insulating layer or may be removed and replaced by another oxide layer or other appropriate insulating layer. Whatever insulating layer is retained on the wafer's surface, apertures are formed for the contacts, if these apertures do not already exist. A conductor layer such as aluminum is deposited on the surface 21 of the wafer and defined to form an ohmic contact 38 to region 32 and a Schottky barrier contact 40 to region 36 as illustrated in FIG. 6.

If the P+ region 32 were not formed, then it might be necessary to sinter the metallization in order to form a reliable ohmic contact between the metallization 38 and region 32. A sintering step performed while an aluminum Schottky contact was present would cause excessive penetration of the aluminum metallization into the region 36 which would either deteriorate or destroy the Schottky barrier. In accordance with the invention, this can be avoided by the formation of the P+ region 32. This often permits a reliable ohmic contact to form between the metallization 38 and the region 32 without any need to sinter the aluminum metallization. The formation of an ohmic contact by direct deposition without subsequent heat treatment depends on the fabrication process used. Processes which permit this are well-known in the art. When such a process is used, both the ohmic contacts 38 and the Schottky barrier contacts 40 may be formed from a single layer of metal without the quality of the Schottky barrier contact between region 36 and metallization 40 being deteriorated by the sintering step.

Where the semiconductor material is silicon and the metallization 40 forming the Schottky barrier contact is aluminum, I have found that soldering the pellet to a header using 400° C. belt furnace deteriorates the Schottky barrier. This appears to be because of the high diffusivity of aluminum in silicon. Where the metallization is titanium or molybdenum, such a belt furnace process has been found to create no significant deterioration in the quality of the Schottky barrier. Accordingly, the wafer fabrication process continues after the formation of the contacts in a normal manner, except that heat treatment steps which would excessively deteriorate the quality of the Schottky barrier contact are avoided.

Figure 7:
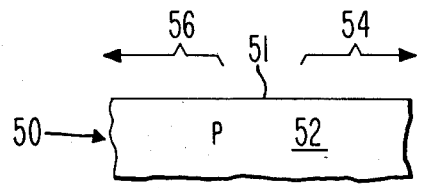
FIGS. 7–12 illustrate steps in a second method of forming both Schottky barrier and ohmic contacts to the same layer of semiconductor material.

Steps in a second fabrication method in accordance with the invention are illustrated in FIGS. 7-12. This method of both fabricating a Schottky barrier contact and making an ohmic contact to the same semiconductor layer avoids the necessity of forming a P+ region for the ohmic contact. In FIG. 7, a wafer 50 having a P type region 52 is illustrated. An ohmic contact is to be made to the portion of the semiconductor material which is indicated by the brackets 54. A Schottky barrier contact is to be made to the portion of the semiconductor material indicated by the bracket 56. The characteristics of the wafer may preferably be initially the same as those specified above for the wafer 20.

Figure 8:
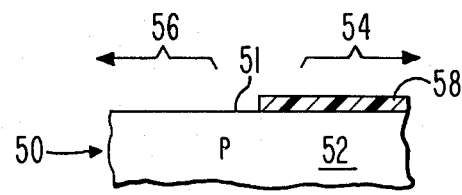

A mask 58 is formed on the wafer to protect the portion 54 where the ohmic contact is to be made, while leaving unprotected the portion 56 where the Schottky barrier is to be made. The location of the mask 58 is illustrated in FIG. 8.

Figure 9:
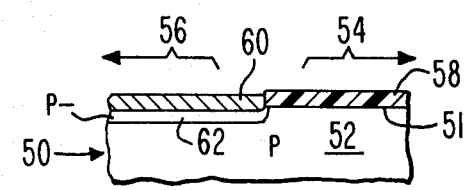

The wafer 50 is then exposed to an ambient environment which leaches the dopant from the semiconductor surface and thereby reduces the concentration of the conductivity type determining dopant material in the surface portion of the P type region 52. For a P type dopant such as boron in silicon, the ambient environment may be one which slowly grows an oxide layer 60 as illustrated in FIG. 9. The slow growth of this oxide leaches the boron from the adjoining portion 62 of the region 52. The mask 58 restricts the leaching to the unmasked portion of the wafer. The composition of the mask 58 is selected to be one which prevents the leaching action of the ambient environment from affecting the underlying portion of the region 52. Where the leaching is accomplished by growing an oxide, the mask 58 may be silicon nitride or any other appropriate material which prevents the oxidation of the underlying portion of the semiconductor material.

The oxide layer 60 may be removed from the wafer along with the mask 58 or may be left on the wafer until later in the process in accordance with the details of the layer 60 and the processing steps which follow the mask removal.

Figure 10:
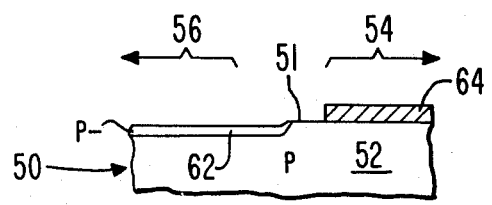
Figure 11:
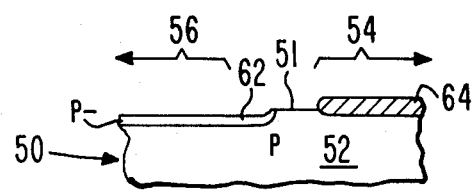

A layer of conductive material which is to form the ohmic contact to the region 52 is deposited on the surface 51 and defined so that the contact material remains in contact with the semiconductor material of region 52 only within the portion 54 where the ohmic contact 64 is desired, as illustrated in FIG. 10. The wafer is treated, preferably by sintering, to form a reliable ohmic contact between the region 52 and the conductor layer 64. Following this sintering step, the wafer appears as illustrated in FIG. 11.

Figure 12:
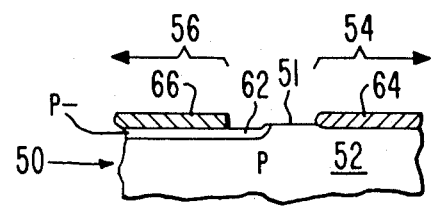

The conductor material which will form the Schottky barrier contact to region 62 in the portion 56 of the wafer is next deposited and defined to leave the contact 66 as illustrated in FIG. 12. The contact 66 contacts the semiconductor material only within the region 62. The conductor 66 and the conductor 64 may be either the same conductor material or may be different conductor materials. If the same conductor material is used for both contacts and the dopant concentration in the portion 54 of region 52 is high enough to assure the formation of an acceptable ohmic contact 64, then a single patterning step can be used to pattern both the ohmic and Schottky barrier contacts simultaneously.

Figure 13:
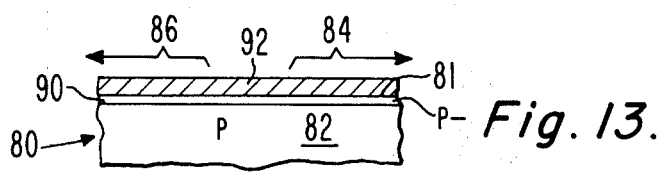
FIGS. 13–15 illustrate steps in a third method of forming both Schottky barrier and ohmic contacts to the same layer of semiconductor material.
Figure 14:
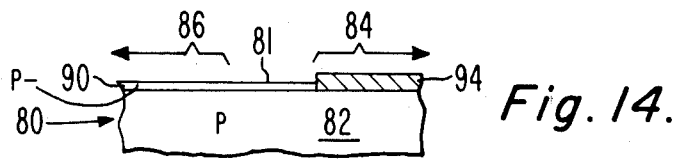
Figure 15:
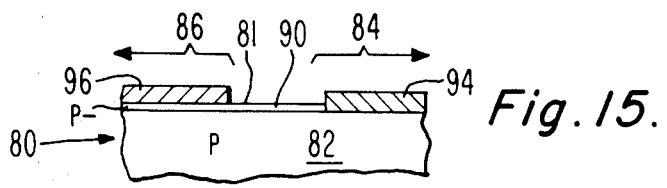

Steps in a third fabrication method in accordance with the invention are illustrated in FIGS. 13-15. This method of both fabricating a Schottky barrier diode and making an ohmic contact leaches both the Schottky barrier contact region and the ohmic contact region of the semiconductor material.

FIG. 13 illustrates a wafer 80 of semiconductor material which includes a region 82 (similar to region 22 of FIG. 1) to which ohmic and Schottky barrier contacts are to be made along a first surface 81 of the wafer.

Once again, P type region 82 may preferably be silicon which is then doped P type with boron doping material. The parameters of the region 82 may be the same as those of the region 22. An ohmic contact is to be formed to the portion 84 of the wafer and a Schottky barrier contact is to be made to the portion 86 of the wafer. As illustrated in FIG. 13, a leaching oxide layer 92 has already been grown on the surface 81 of the wafer 80. This has created a leached P− region 90 along the surface 81.

Following the formation of the leached P− region 90, the oxide layer 92 is removed and a layer of metallization is deposited on the surface 81. This metallization is defined so that only a contact portion 94 is retained as shown in FIG. 14. The contact portion 94 of the metallization is restricted to the portion 84 where the ohmic contact is desired. The wafer is then sintered or otherwise treated to cause the formation of an ohmic contact between the metallization 94 and the P type region 82. This is preferably achieved by causing the metallization 94 to alloy with the underlying semiconductor material and penetrate through the leached region 90 to the underlying high concentration region 82. This assures a minimum contact resistance in the ohmic contact. Following this sintering step, the wafer appears as illustrated in FIG. 14.

Following the sintering of the contact 94, a Schottky barrier contact forming conductor layer is deposited on the surface 81 and defined so that it remains as a contact 96 only on the portion 86 of the wafer where the Schottky barrier contact is to be formed as shown in FIG. 15. The retained metallization 96 constitutes the conductor portion of the Schottky barrier contact.

In view of the above description of this invention, the selection of appropriate conductor materials for use for the ohmic contacts and the Schottky barrier contacts is well within the skill of one having ordinary skill in the art. Any conductor material which will behave in an appropriate manner may be utilized. The heat treating processes which may be utilized depend on the semiconductor material and the conductor materials selected. The selection of these process steps is also well within the skill of one of ordinary skill in the art in view of the above description of the invention.

The method of this invention is applicable to other semiconductor materials, dopants and conductivity types so long as it is possible to significantly reduce the dopant concentration in a surface region of the semiconductor by leaching dopant material from the semiconductor by exposure to a selected ambient environment. Thus, with silicon, this technique is generally applicable to those P type dopants which have a greater affinity for silicon oxide than for the silicon itself. For those N type dopants which have a greater affinity for the silicon than for the silicon oxide, this technique is not applicable using a silicon oxide, since that causes those dopants to selectively segregate in the surface of the semiconductor material and increase the dopant concentration there.

The primary advantage of this process is that without the need to grow an epitaxial layer, it enables the fabrication of a Schottky barrier diode in a surface portion of a semiconductor region which otherwise would have had too high a dopant concentration to fabricate the desired Schottky barrier diode directly on that material. Further, it makes feasible the fabrication of such devices in which both the ohmic contacts and the Schottky barrier diode are both metallized with the same metallization materials, either in the same or in sequential steps.

The first embodiment of this invention (illustrated in FIGS. 3-6) yields the most reliable ohmic and Schottky barrier contacts. The second embodiment (illustrated in FIGS. 7-12) makes ohmic contact to lower dopant concentration regions than the first embodiment does. The third embodiment (illustrated in FIGS. 13-15) requires a sintering of the metallization 94 through the reduced dopant concentration region 90. Each of these methods will be preferred for some applications and not for others. Those of ordinary skill in the art will be able to select a preferred process for their application in view of the above descriptions and in accordance with their final device requirements and the process steps needed to produce their desired structure and the extent, if any, to which their process steps can perform the dual functions of aiding in the formation of their basic device structure while simultaneously aiding in the formation of a Schottky barrier contact in accordance with the invention.

A Schottky barrier diode fabricated in accordance with this invention comprises a conductor making a Schottky contact to a leached surface portion of a semiconductor material. As has been indicated above, the leached region in silicon will generally have a depth ranging up to about several thousand angstroms when the silicon is boron doped. Other dopants and other semiconductor materials will result in different leached depths in accordance with the diffusivity of the dopant in the host semiconductor material and the relative affinity of the dopant material for the semiconductor material and the leaching ambient environment. The primary aspect of the invention is the formation of a Schottky barrier contact to a leached region of a semiconductor body. Thus, although each of the illustrated embodiments includes the steps of forming an ohmic contact to the same layer to which the Schottky barrier contact is formed, it will be understood that the formation of the ohmic contact along with the Schottky barrier contact is not a necessary part of this invention. Rather, these embodiments have been illustrated because they illustrate the flexibility and power of the invention and are applications for which its use is particularly appropriate.

In accordance with the above described preferred embodiments, an improved method of forming Schottky barrier contacts to semiconductor structures has been illustrated and described, as have been improved semiconductor structures. Those skilled in the art will be able to vary the parameters of the disclosed methods and devices without departing from the scope of the invention as defined by the appended claims.

What is claimed is:

1. A method of forming a Schottky barrier contact and an ohmic contact on a semiconductor wafer having a metal concentration of a conductivity type determining dopant which is too large to support the formation of the desired Schottky barrier between said Schottky barrier contact and said semiconductor wafer, said method comprising the steps of:

exposing that region of said wafer where said Schottky barrier contact is to be formed to leaching ambient conditions which cause a reduction in the concentration of the conductivity determining dopant in said region for a time sufficient to reduce the dopant level at and adjacent the surface of said region to one which will support said Schottky barrier;

disposing a conductor on said surface of said region to form a Schottky barrier contact and simultaneous therewith disposing a conductor on the surface of another region of said wafer to form an ohmic contact.

2. A method in accordance with claim 1 wherein said surface of said region where said Schottky barrier contact is to be formed is masked and wherein additional conductivity type determining dopant is introduced into said surface of said another region before said surface of said region is exposed to said leaching ambient.

3. A method in accordance with claim 1 wherein said surface of said another region is masked while said surface of said region is exposed to said leaching ambient.

4. A method in accordance with claims 2 or 3 wherein said region of said wafer where said Schottky barrier contact is to be formed is exposed to leaching ambient conditions a plurality of times.

5. A method in accordance with claim 1 wherein when said region is exposed to leaching ambient conditions an oxide layer is formed on said region.

6. A method in accordance with claim 5 further including stripping said oxide layer from said region and again exposing said region to leaching ambient conditions before disposing said conductors.

* * * * *